United States Patent
Chan et al.

(10) Patent No.: US 11,430,876 B2
(45) Date of Patent: Aug. 30, 2022

(54) METHOD FOR PRODUCING SELF-ALIGNED GATE AND SOURCE/DRAIN VIA CONNECTIONS FOR CONTACTING A FET TRANSISTOR

(71) Applicant: IMEC vzw, Leuven (BE)

(72) Inventors: Boon Teik Chan, Wilsele (BE); Dunja Radisic, Heverlee (BE); Steven Demuynck, Aarschot (BE); Efrain Altamirano Sanchez, Kessel-Lo (BE); Soon Aik Chew, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 17/083,125

(22) Filed: Oct. 28, 2020

(65) Prior Publication Data
US 2021/0126108 A1    Apr. 29, 2021

(30) Foreign Application Priority Data
Oct. 29, 2019  (EP) .................................... 19206038

(51) Int. Cl.
*H01L 29/66*  (2006.01)
*H01L 21/768*  (2006.01)

(52) U.S. Cl.
CPC .. *H01L 29/66515* (2013.01); *H01L 21/76805* (2013.01); *H01L 21/76846* (2013.01); *H01L 21/76895* (2013.01); *H01L 21/76897* (2013.01)

(58) Field of Classification Search
CPC ......... H01L 29/66515; H01L 21/76805; H01L 21/76846; H01L 21/76895;
(Continued)

(56) References Cited

U.S. PATENT DOCUMENTS 9,496,362 B1  11/2016  Alptekin et al.
10,026,824 B1  7/2018  Chanemougame et al.
(Continued)

FOREIGN PATENT DOCUMENTS

| CN | 108122824 | 6/2018 |
|----|-----------|--------|
| DE | 10 2015 114790 A1 | 2/2017 |
| WO | WO 2018/236355 A1 | 12/2018 |

OTHER PUBLICATIONS

Dunja Radisic et al., Plasma etch selectivity study and material screening for self-aligned gate contact (SAGC), Proceedings of SPIE, Mar. 20, 2019, vol. 10963, pp. 109630P-1-14.
(Continued)

*Primary Examiner* — Thanhha S Pham
(74) *Attorney, Agent, or Firm* — Knobbe, Martens, Olson & Bear, LLP

(57) ABSTRACT

The disclosed technology is related to a method that includes the formation of contact vias for contacting gate electrodes and source (S) or drain (D) electrodes of nano-sized semiconductor transistors formed on a semiconductor wafer. The electrodes are mutually parallel and provided with dielectric gate and S/D plugs on top of the electrodes, and the mutually parallel electrode/plug assemblies are separated by dielectric spacers. The formation of the vias takes place by two separate self-aligned etch processes, the Vint-A etch for forming one or more vias towards one or more S/D electrodes and the Vint-G etch for forming one or more vias towards one or more gate electrodes. According to the disclosed technology, a conformal layer is deposited on the wafer after the first self-aligned etch process, wherein the conformal layer is resistant to the second self-aligned etch process. The conformal layer thereby protects the first contact via during the second self-aligned etch.

7 Claims, 6 Drawing Sheets

(58) Field of Classification Search
CPC ......... H01L 21/76897; H01L 21/76804; H01L 21/76844; H01L 21/823475; H01L 29/41791; H01L 29/66795; H01L 21/823431
See application file for complete search history.

(56) References Cited

U.S. PATENT DOCUMENTS

| | | |
|---|---|---|
| 10,950,728 B2 * | 3/2021 | Chang ............. H01L 21/823828 |
| 2017/0053804 A1 | 2/2017 | Lu et al. |
| 2017/0194211 A1 | 6/2017 | Lai et al. |
| 2017/0317076 A1 | 11/2017 | Shen et al. |
| 2019/0165176 A1 | 5/2019 | Wang et al. |

OTHER PUBLICATIONS

Extended European Search Report dated Apr. 14, 2020 in European Application No. EP 19206038.2.

* cited by examiner

METHOD FOR PRODUCING SELF-ALIGNED GATE AND SOURCE/DRAIN VIA CONNECTIONS FOR CONTACTING A FET TRANSISTOR

CROSS-REFERENCE TO RELATED APPLICATIONS

This application claims foreign priority to EP 19206038.2 filed Oct. 29, 2019, the contents of which are incorporated by reference herein in their entirety.

BACKGROUND OF THE INVENTION

Technological Field

The disclosed technology is related to semiconductor processing, in particular to the production of via connections for contacting gate and source/drain contacts of nano-scaled transistors.

Description of the Related Technology

The continuous downscaling of semiconductor devices has created many challenges in terms of the development of technologies able to produce the devices. The pitch and width of semiconductor fins for producing finFET transistors has now reached the order of a few tens of nanometres and is expected to further shrink in the future. The gate and source/drain contacts extending transversally to the fins have likewise become smaller. One particular difficulty has been the production of via connections between the first metallization level in a semiconductor chip and the source, drain and gate electrodes of transistors processed at nano-sized dimensions. The limitations of standard lithography processes, especially in terms of the control of the overlay between consecutive layers, have become apparent in the production of these via connections. A solution to this problem is the so-called self-aligned contact (SAC) approach, wherein selective plasma etch steps are applied to locally remove dielectric plugs from the top of the gate and S/D electrodes, followed by metal filling. The self-aligned aspect of the plasma etch allows to use a hardmask with larger openings than the via dimensions, thereby avoiding overlay-related inaccuracies of traditional lithography at the nano-sized dimensions. Details of this technology are described for example in document "Plasma etch selectivity study and material screening for Self-Aligned Gate Contact (SAGC)", Dunja Radisic et al, SPIE proceedings volume 10963, published 17 Jun. 2019. As stated in this document, separate self-aligned patterning steps are required for producing the respective vias to the gate electrode (referred to as Vint-G etch) and to the S/D electrode (Vint-A etch).

A problem of the use of separate patterning steps is that the first of the vias that is produced, usually this is the Vint-A etch, exposes materials which are likely to be attacked during the second etch step, because of the oversized dimensions of the mask. This problem is addressed today by depositing the hardmask material used for the second etch into the via produced by the first etch and leaving the mask material in place when the second etch step is performed. However, the mask material is not always compatible with the selectivity of some of the etch recipes, so this is not a preferred solution to the problem. For example, a hardmask that is used frequently for this type of application is a spin-on carbon (SOC) mask, while preferred materials for the dielectric plugs on top of the gate and S/D contacts are respectively silicon nitride and silicon oxide. Preferred etch processes for removing silicon oxide selectively with respect to silicon nitride and vice versa require a carbon-free etch recipe, but the use of an SOC hardmask is not compatible with such an etch recipe. Also, a further SOC hardmask is often deposited and etched back to form protective plugs in the Vint-A and Vint-G vias while etching the trenches for the first metallization layer. This is disadvantageous as it may cause micro-loading effects and the etch-back uniformity may be insufficient.

SUMMARY OF CERTAIN INVENTIVE ASPECTS

The disclosed technology aims to provide a method for performing the self-aligned Vint-A and Vint-G etch steps, that overcomes the above-described problems. This aim is achieved by the method according to the appended claims.

The method of the disclosed technology includes the formation of contact vias for contacting gate electrodes and source or drain electrodes of nano-sized semiconductor transistors formed on a semiconductor wafer. The electrodes are mutually parallel and provided with dielectric gate and S/D plugs on top of the electrodes, and the mutually parallel electrode/plug assemblies are separated by dielectric spacers. The formation of the vias takes place by two separate self-aligned etch processes, the Vint-A etch for forming one or more vias towards one or more S/D electrodes and the Vint-G etch for forming one or more vias towards one or more gate electrodes. According to the disclosed technology, a conformal layer is deposited on the wafer after the first self-aligned etch process, wherein the conformal layer is resistant to the second self-aligned etch process. The conformal layer thereby protects the first contact via during the second self-aligned etch.

The disclosed technology is in particular related to a method for producing two via connections respectively to a gate electrode and to a source or drain electrode, hereafter referred to as S/D electrode, of a nano-sized field effect transistor, comprising the steps of providing a semiconductor wafer comprising a plurality of transistors, which include an array of mutually parallel electrodes, comprising gate electrodes and S/D electrodes arranged between two adjacent gate electrodes, wherein:
the gate electrodes are provided with a dielectric gate plug on top of the gate electrodes,
the S/D electrodes are provided with a dielectric S/D plug on top of the S/D electrodes, and
adjacent assemblies of electrodes and plugs of different types (S/D or gate) are separated by dielectric spacers,
the remaining areas between the plugs and the spacers is filled with a dielectric material, and wherein the upper surface of the plugs, the spacers and the dielectric material is a planarized surface,
performing a first lithography and etch process to thereby locally remove a portion of a plug of a first type (S/D or gate) relative to the spacers and to the plugs of the second type (gate or S/D), the removal of the plug portion leading to the formation of a first contact via, said first via exposing the electrode of the first type (S/D or gate), wherein the first etch process is self-aligned with respect to the spacers, followed by:
depositing a first conformal layer on the wafer, followed by:

performing a second lithography and etch process, comprising the application of at least a first and a second etch recipe to thereby:
locally remove a portion of the first conformal layer by applying the first etch recipe,
locally remove a portion of said plug of the second type (gate or S/D) relative to the spacers and to the plugs of the first type (S/D or gate) by applying the second etch recipe, the removal of the plug leading to the formation of a second contact via, said second via exposing the electrode of the second type (gate or S/D), wherein the local removal of the plug is self-aligned with respect to the spacers and wherein the first conformal layer is resistant to the second etch recipe, followed by:
filling the first and second contact vias with an electrically conductive material to thereby form self-aligned via connections for contacting the gate electrode and the S/D electrode.

According to an embodiment of the method described in the previous paragraph:
the first lithography and etch process comprises the step of depositing and patterning a first mask layer, so that a first opening is formed in the first mask layer that overlaps the plug of the first type (S/D or gate) in the direction perpendicular to the spacers, said first opening being wider than the plug of the first type as seen in said direction perpendicular to the spacers,
the second lithography and etch process comprises the step of depositing and patterning a second mask layer, so that a second opening is formed in the second mask layer that overlaps the plug of the second type (gate or S/D) in the direction perpendicular to the spacers, said second opening being wider than the plug of the second type as seen in said direction perpendicular to the spacers.

According to the latter embodiment, a pre-metal dielectric (PMD) layer may be deposited on the planarized surface, before the first and second lithography and etch processes, wherein the first and second mask layers are deposited on the pre-metal dielectric layer, and wherein the width of the first and second openings in the respective mask layers, as seen in the direction perpendicular to the spacers, is transferred by etching through the PMD layer, to respective first and second openings in the PMD layer, prior respectively to performing the first etch process and applying the second etch recipe of the second etch process. The first and/or the second mask layer may be removed after the formation of the respective first and second openings in the PMD layer and prior respectively to performing the first etch process and applying the second etch recipe of the second etch process.

The disclosed technology may also be described as related to a method for producing two via connections respectively to a gate electrode and to a source or drain electrode, hereafter referred to as S/D electrode, of a nano-sized field effect transistor, comprising the steps of:
providing a semiconductor wafer comprising a plurality of transistors, which include an array of mutually parallel electrodes, comprising gate electrodes and S/D electrodes arranged between two adjacent gate electrodes, wherein:
the gate electrodes are provided with a dielectric gate plug on top of the gate electrodes,
the S/D electrodes are provided with a dielectric S/D plug on top of the S/D electrodes, and
adjacent assemblies of electrodes and plugs of different types (S/D or gate) are separated by dielectric spacers,
the remaining areas between the plugs and the spacers is filled with a dielectric material, and wherein the upper surface of the plugs, the spacers and the dielectric material is a planarized surface,
performing a first lithography and etch process to thereby locally remove a portion of a plug of a first type (S/D or gate) relative to the spacers and to the plugs of the second type (gate or S/D), the removal of the plug portion leading to the formation of a first contact via, said first via exposing the electrode of the first type (S/D or gate), wherein the first etch process is self-aligned with respect to the spacers, followed by:
depositing a first conformal layer on the wafer, followed by:
performing a second lithography and etch process to thereby locally remove a portion of a plug of the second type (gate or S/D) relative to the spacers and to the plugs of the first type (S/D or gate), the removal of the plug leading to the formation of a second contact via, said second via exposing the electrode of the second type (gate or S/D), wherein the second etch process is self-aligned with respect to the spacers and wherein the first conformal layer is resistant to the second etch process, followed by:
filling the first and second contact vias with an electrically conductive material to thereby form self-aligned via connections for contacting the gate electrode and the S/D electrode.

According to an embodiment:
the first lithography and etch process comprises the step of depositing and patterning a first mask layer, so that a first opening is formed in the first mask layer that overlaps the plug of the first type (S/D or gate) in the direction perpendicular to the spacers, said first opening being wider than the plug of the first type as seen in said direction perpendicular to the spacers,
the second lithography and etch process comprises the step of depositing and patterning a second mask layer, so that a second opening is formed in the second mask layer that overlaps the plug of the second type (gate or S/D) in the direction perpendicular to the spacers, said second opening being wider than the plug of the second type as seen in said direction perpendicular to the spacers.

According to the latter embodiment, a pre-metal dielectric (PMD) layer may be deposited on the planarized surface, before the first and second lithography and etch processes, the first and second mask layers may be deposited on the pre-metal dielectric layer, and the width of the first and second openings in the respective mask layers, as seen in the direction perpendicular to the spacers, may be transferred by etching through the PMD layer, to respective first and second openings in the PMD layer, prior respectively to performing the first and second etch process. The first and/or the second mask layer may be removed after the formation of the respective first and second openings in the PMD layer and prior respectively to the first and second etch processes.

According to an embodiment, a second conformal layer is deposited on the wafer, after the formation of the second contact via and before the filling step.

The method may further comprise the step of forming first and second trenches in the PMD layer, wherein the filling step is configured to fill the contact vias and the trenches to form respectively the via connections and a first and second conductor connected to the respective vias, said conductors being part of a first metallization level for contacting the transistors. According to the latter embodiment, the first etch process for forming the first contact via may also form the first and second trench in the PMD layer.

DETAILED DESCRIPTION OF CERTAIN ILLUSTRATIVE EMBODIMENTS

Figure 1:
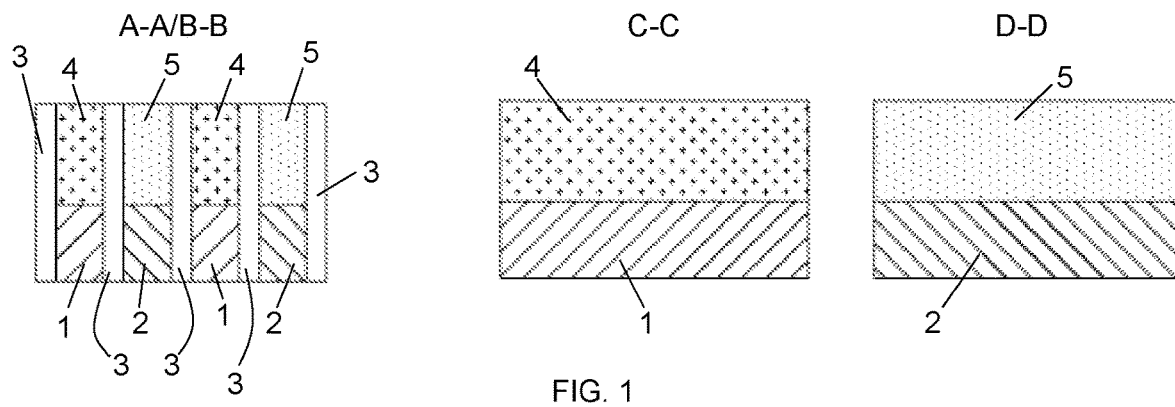
FIG. 1 shows a top view and four section views of a structure obtained after front-end-of-line processing of a semiconductor wafer, and onto which the method according to an embodiment of the disclosed technology may be applied.

FIG. 1 illustrates a small area of a silicon wafer after the processing of multiple FET transistors on the wafer, i.e., at the end of the so-called front end-of-line (FEOL) stage of a fabrication process for producing multiple chips on the wafer. A top view is shown, as well as 4 section views: views A-A and B-B, which are identical, and views C-C and D-D. The structure comprises mutually parallel metal gate electrodes 1 and metal source or drain electrodes 2 separated by dielectric spacers 3. On top of the electrodes, dielectric plugs 4 and 5 are present, equally separated by the spacers 3, i.e., the spacers separate the parallel electrode/plug assemblies. The electrodes 1,2 and plugs 4,5 extend over a given distance in the vertical direction of the top view. On both sides of the plugs and electrodes, a further dielectric material 9 is present, which separates the electrodes and plugs shown in the drawing from further electrodes and plugs situated outside the drawn area.

For the sake of explaining the disclosed technology and without meaning to limit the scope of the disclosed technology, the following materials are used for the above-described areas: the gate electrodes 1 are formed of copper or tungsten, the gate plugs 4 are formed of $Si_3N_4$, hereafter also referred to as silicon nitride. The S/D electrodes are formed of a stack of Ti, TiN and W. The S/D plugs 5 are formed of $SiO_2$, and the spacers 3 are formed of SiCO (silicon oxycarbide). The dielectric 9 is also $SiO_2$, i.e., the same material as the S/D plugs 5, but a different type of hatching is applied in the drawings to indicate that the plugs 5 are limited in their longitudinal direction. Transversally with respect to the structure, and underneath it, an array of silicon fins or otherwise shaped active areas is present (not shown), in which channel areas are formed between a source and drain electrode, controlled by a gate electrode. The dimensions of the various parts of the structure are in the order of tens of nanometres or less. For example, the width of the gate electrodes 1 and gate plugs 4 and of the S/D electrodes 2 and S/D contact plugs 5 may be between 10 and 20 nm, while the width of the spacers 3 may be about 5 to 8 nm.

This structure and the way it can be fabricated is known to the person skilled in the art and this fabrication process is therefore not described here in detail. The structure may be produced by the well-known replacement gate technique, in which polysilicon dummy gates are selectively etched and replaced by a gate oxide layer and a metal gate electrode 1 with the gate plugs 4 on top of the metal gate electrodes. The S/D electrodes 2 may be formed by a self-aligned etch in areas between the gate plugs 4, followed by a metal fill and S/D plug deposition. The situation shown in FIG. 1 is obtained after these steps and after a planarization step, creating a level upper surface.

FIGS. 2 to 14 illustrate the steps according to an embodiment of the disclosed technology, for producing two metal-filled via connections, one via connection towards a gate electrode 1 and one via connection towards a S/D electrode 2, and for producing conductors connected to said via connections. The conductors are part of the first metallization level of the so-called back end of line (BEOL) portion of a chip, i.e. the multilevel metallization structure that is to be produced on top of the transistors.

Figure 2:
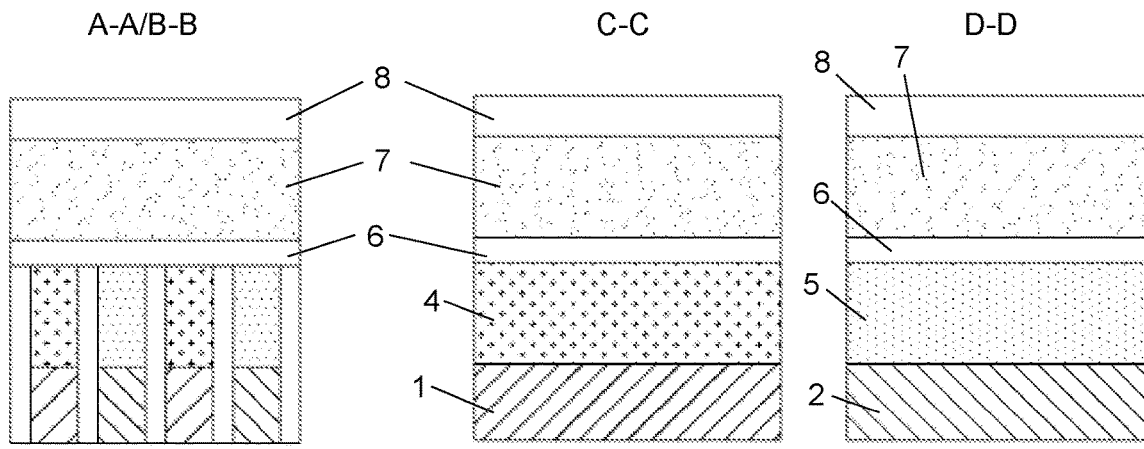
FIGS. 2 to 15 illustrate the steps of the method according to said embodiment of the disclosed technology, applied to the structure shown in FIG. 1. The effect of each step is shown in the four section views A-A, B-B, C-C and D-D indicated in FIG. 1.

As seen in FIG. 2, a stack of layers is produced on the level surface: an etch stop layer 6, followed by a pre-metal dielectric (PMD) layer 7, and a hardmask layer 8. The etch stop layer 6 is formed of silicon carbonitride (SiCN). The PMD layer 7 is $SiO_2$, and the hardmask layer 8 is titanium nitride (TiN). In this particular example, the material of the PMD 7 is the same as the material of the S/D plugs 5, namely $SiO_2$. This is the main reason why the etch stop layer 6 is required in this case, namely in order to control the etching of the PMD 7 during subsequent etch processes, without prematurely attacking the S/D plugs 5. If other materials are used for the PMD, for example a low-k dielectric, the etch stop layer 6 may be omitted. The thicknesses and deposition techniques used for producing layers 6, 7 and 8 may be in accordance with prior art methods.

Figure 3:
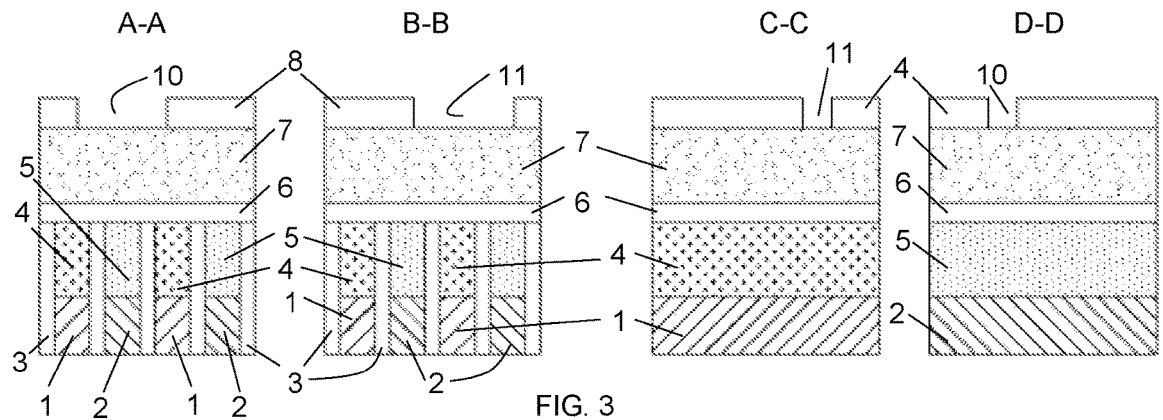

With reference to FIG. 3, the hardmask layer 8 is patterned by a standard lithography process: two openings 10 and 11 are etched in the hardmask, defining the dimensions of conductors of the first metallization level.

Figure 4:
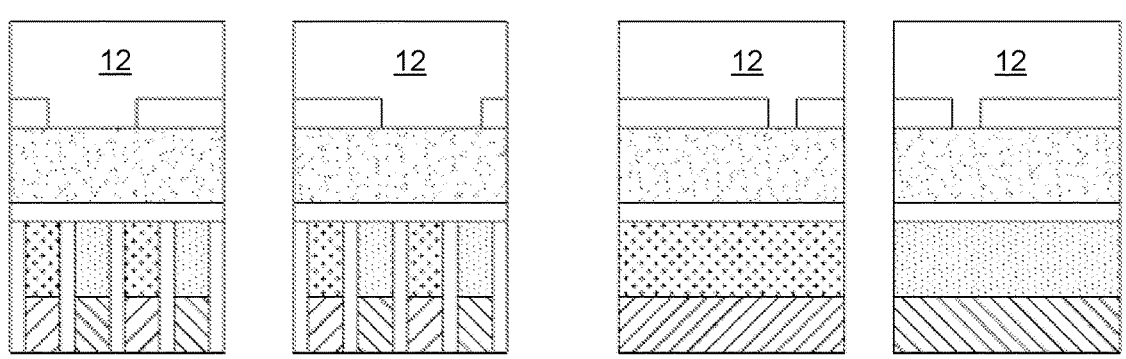
Figure 5:
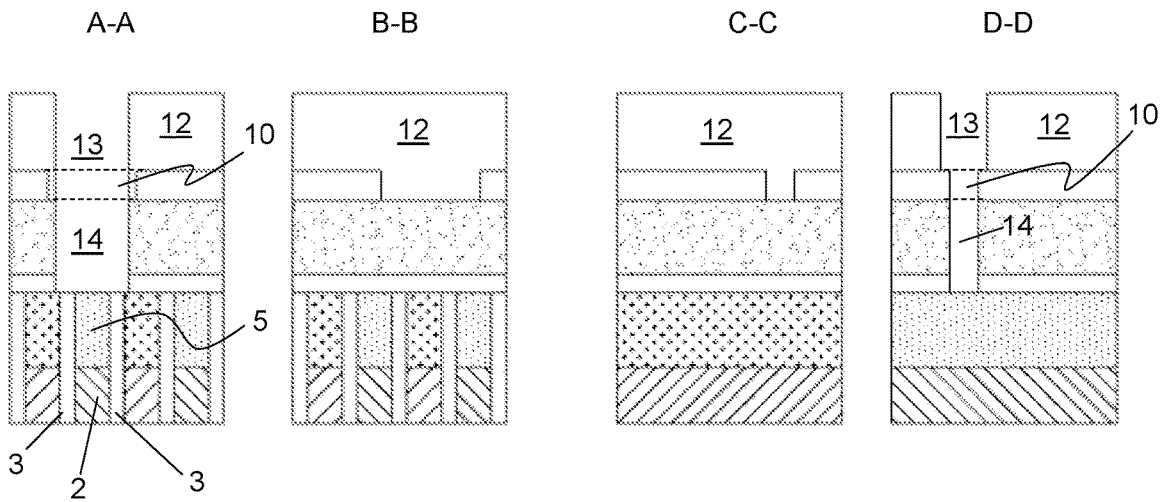

Then a further hardmask 12 is deposited on the wafer, as shown in FIG. 4. This may be a spin-on carbon (SOC) mask or a stack of SOC and a thinner layer of spin-on glass (SOG), which form a multilayer stack known as such in the art for patterning nano-sized features. With reference to FIG. 5, the hardmask 12 is patterned by lithography and etching, so as to form an opening 13 above one of the S/D electrodes 2, followed by an anisotropic etch to form an opening 14 through the PMD layer 7 and the etch stop layer 6. As seen in the A-A section in FIG. 5, the opening 13 is lying within the borders of the opening 10 produced in the TiN hardmask 8, as seen in the direction perpendicular to the spacers 3. Also, in this direction perpendicular to the spacers 3, the width of the opening 13 is thus transferred to the opening 14 by the anisotropic etch. Still in the same direction perpendicular to the spacers, the width of the opening 14 is wider than the width of the S/D plug 5 and fully overlaps the width of the S/D plug 5. In the direction parallel to the spacers 3, as seen in the D-D section in FIG. 5, the opening 13 is wider than the opening 10 in the TiN hardmask 8, so that this latter opening 10 defines the width of the opening 14 etched down to and including the etch stop layer 6. The formation of the opening 14 is also a step that is known from the above-described prior art methods for realizing the Vint-A etch and Vint-G etch. Any details of the etch processes used in the prior art are applicable in this step of the method of the disclosed technology. For example, different etch recipes are used for etching through the PMD layer 7 and through the etch stop layer 6.

Figure 6:
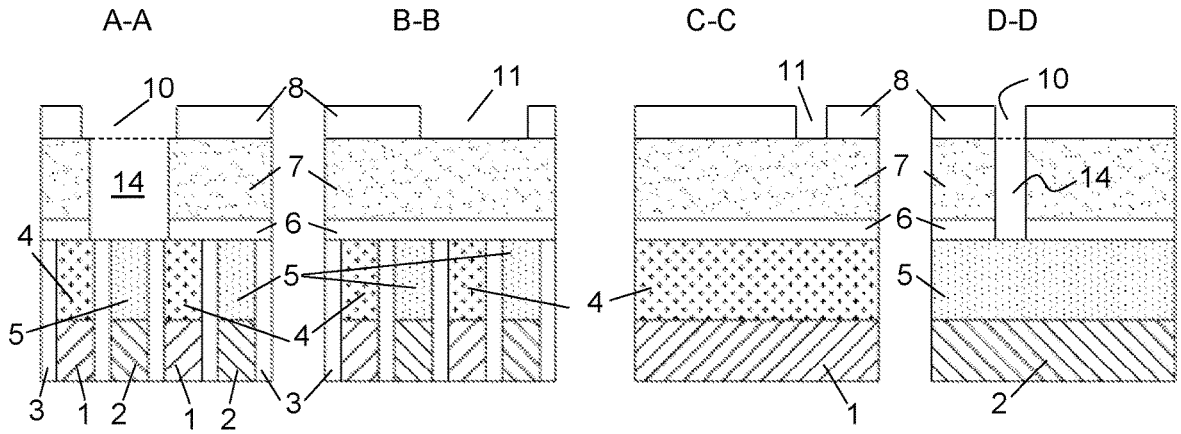

The SOC hardmask 12 is now stripped, as illustrated in FIG. 6, leaving the etch stop layer 6 and the PMD layer 7 with the opening 14 therein, and the TiN hardmask 8. Now an anisotropic plasma etch process is applied, see FIG. 7, that removes the SiO$_2$ of the S/D contact plug 5 with high selectivity relative to the silicon nitride gate plugs 4 and the SiCO spacers 3, while at the same time creating trenches 16 and 17 in the PMD layer 7, in accordance with the openings 10 and 11 in the TiN mask 8. The atomic layer etch (ALE) or quasi-atomic layer etch (Q-ALE) processes may be used for this purpose. These processes are known as such and described for example in the above-cited article "Plasma etch selectivity study and material screening for Self-Aligned Gate Contact (SAGC)". The processes consist of a number of cycles of depositing a carbon-fluoride-based polymer and a sputtering etch step in a noble gas (e.g. Ar) atmosphere. The good selectivity is however assured only when the process can operate in carbon-free conditions. This is why the SOC mask 12 is stripped prior to the plasma etch.

Figure 7:
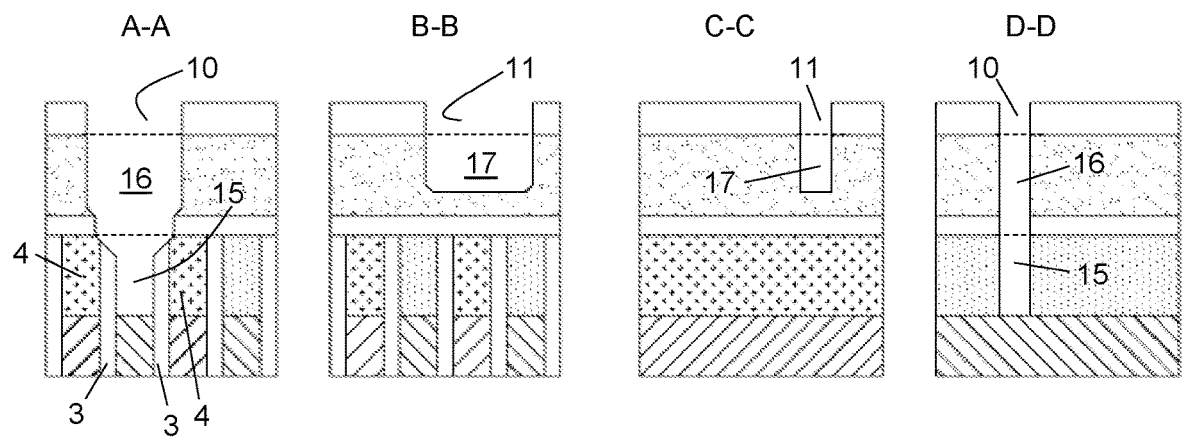

Due to the selectivity of this etch process, and the oversized dimensions of the opening 14 relative to the width of the S/D plug 5, this plasma etch step realizes a S/D contact via 15 (the so-called Vint-A etch), in a self-aligned manner relative to the spacers 3. However, as seen in FIG. 7, the top region of the spacers 3 is etched away according to tapered etch surfaces because the etch process is not 100% selective. This also exposes the silicon nitride of the adjoining gate plugs 4, which is why this exposed material needs to be protected during the Vint-G etch.

In the direction parallel to the gates (section D-D of FIG. 7), the contact via 15 remains aligned to the original opening 10 in the TiN mask 8. The trenches 16 and 17 are created simultaneously with the formation of the contact via 15 because the material of the S/D plugs 5 and of the PMD layer 7 is the same. In cases where this material is different, the trench etch needs to take place separately from the via etch.

Figure 8:
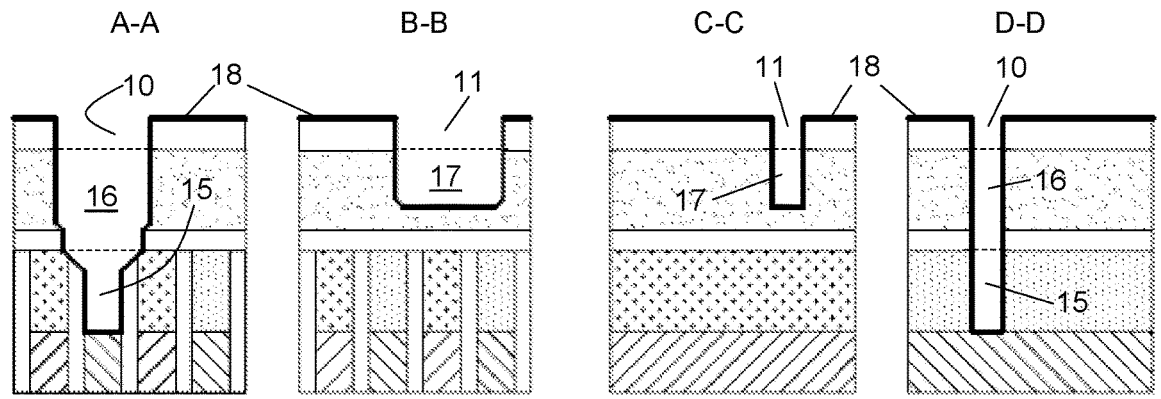

The next step is characteristic to the disclosed technology. A conformal layer 18 is deposited on the wafer, as illustrated in FIG. 8. The conformal layer is a few nanometres thick, for example 4 to 6 nm, and may be applied by atomic layer deposition (ALD), a technique known as such in the art. The conformal layer 18 may follow the topography of the wafer surface. In combination with the various materials used in the present example, the conformal layer 18 may be a stack of a Ti layer with a TiN layer on top of the Ti layer, or a stack of a Ta layer with a TaN layer on top of the Ta layer. The material of the conformal layer 18 is such that it is resistant to the V-int G etch, described hereafter.

Figure 9:
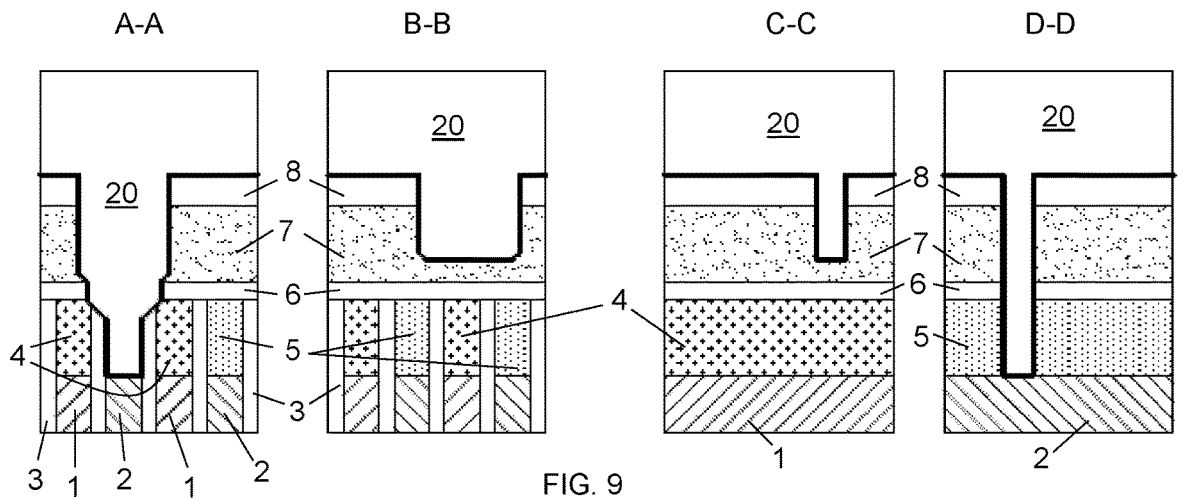
Figure 10:
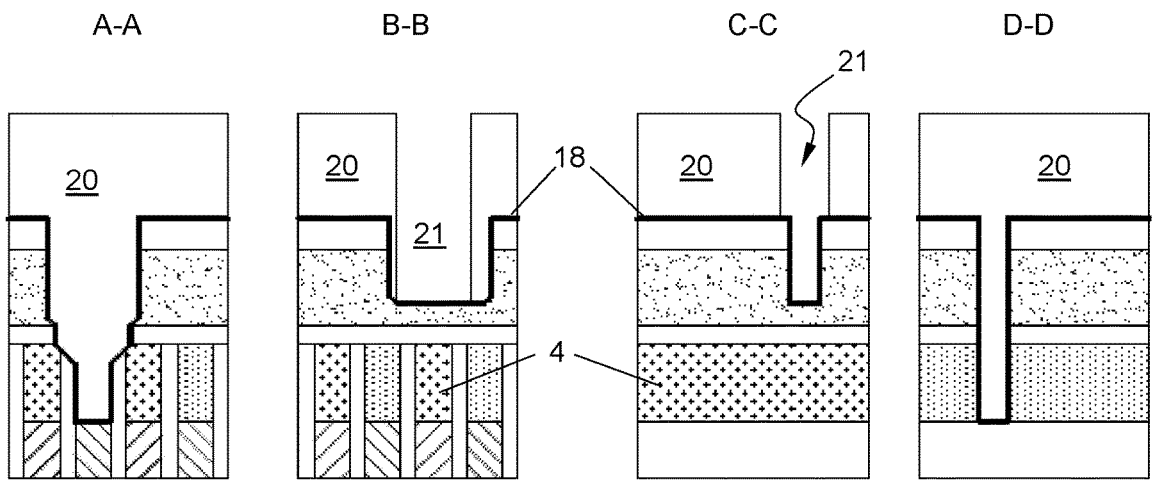
Figure 11:
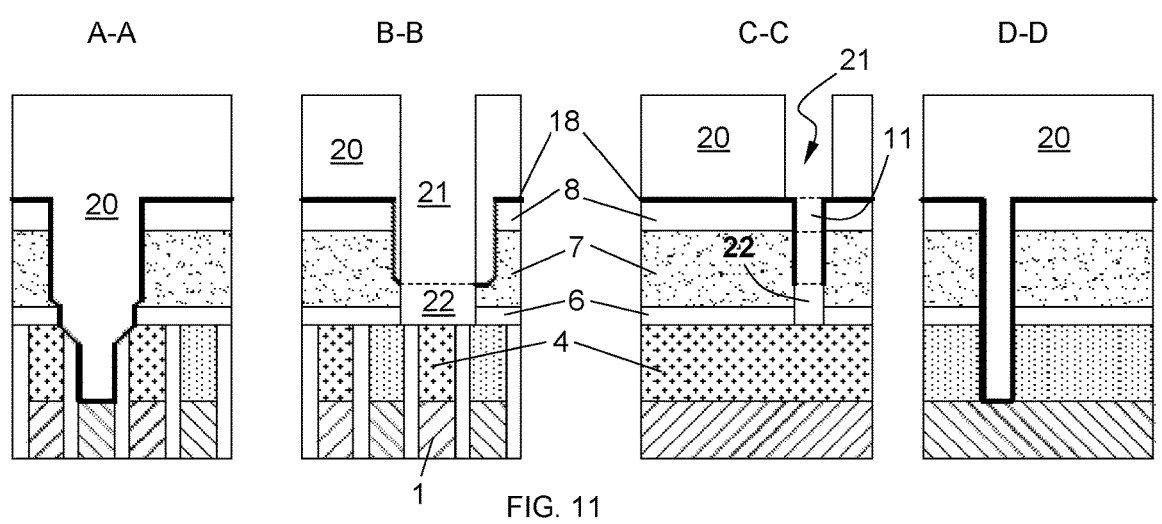

A second hardmask 20 is deposited (preferably SOC/SOG) as shown in FIG. 9. The hardmask 20 is patterned, see FIG. 10, creating an opening 21 in the hardmask 20, above a metal gate 1 and its gate plug 4, as illustrated in FIG. 10. As shown in FIG. 11, this is followed by producing an opening 22 through the protection layer 18, the PMD layer 7 and the etch stop layer 6. Producing opening 22 requires at least one first etch recipe to remove the conformal layer 18 from the bottom of the opening 21, preferably by anisotropic etching of the conformal layer 18. This same first etch recipe, or a sequence of further etch recipes is then applied for anisotropically etching through the PMD layer 7 and the etch stop layer 6, to thereby transfer the width of the opening 21 to the opening 22. In the end, the planarized surface of the plugs 4,5 and the spacers 3 is exposed at the bottom of the opening 22. In the direction perpendicular to the spacers 3, the opening 22 lies within the boundaries of the trench 17. In the direction parallel to the spacers 3, the opening 21 is wider than the opening 11 in the hardmask 8, so that the opening 22 remains aligned to the opening 11 in this direction (see section C-C in FIG. 11).

Figure 12:
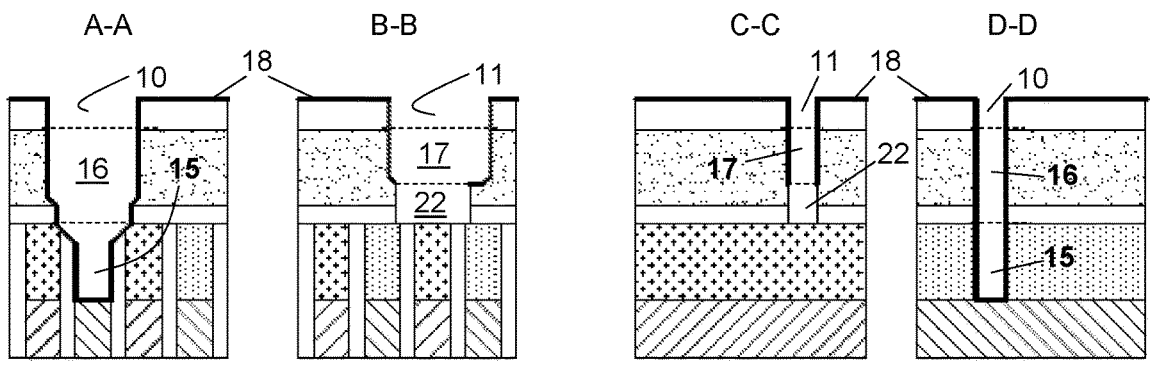
Figure 13:
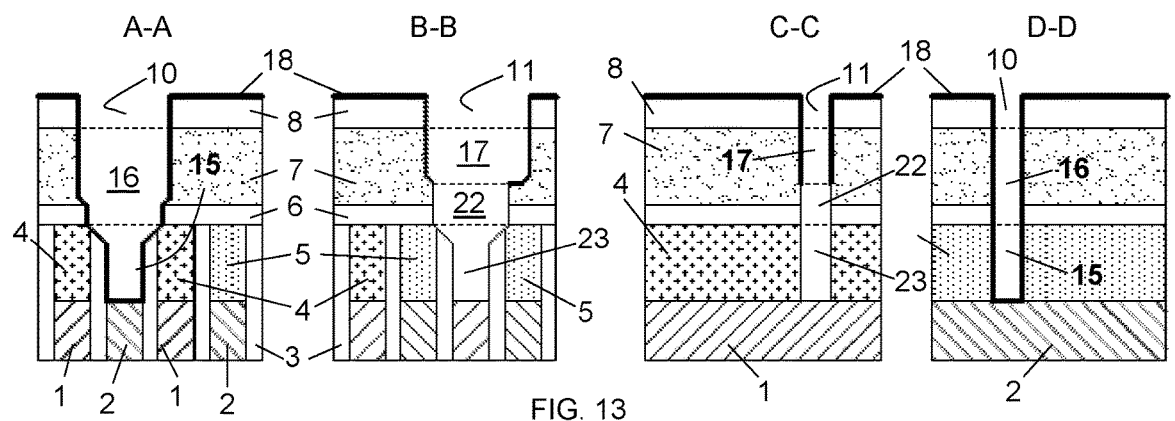

The second hardmask 20 is now stripped, see FIG. 12. This step is different from the prior art methods, in which the SOC mask is maintained during the Vint-G etch, in order to protect the exposed silicon nitride in the Vint-A via 15. This protection is now realized by the conformal layer 18. Therefore, the self-aligned etch process for creating the Vint-G contact via 23 can now be performed in a carbon-free environment, see FIG. 13. As stated above, the conformal layer 18 is resistant to the Vint-G etch, which means that the self-aligned etch process is done by applying a second etch recipe different from the one used for removing the conformal layer 18 from the bottom of opening 21. The second etch recipe may again consist of a plasma etch process known as such, and referred to also in the above-cited article, using a CH$_2$F$_2$-based or CH$_3$F-based plasma etch process with addition of gaseous O$_2$ or H$_2$.

Figure 14:
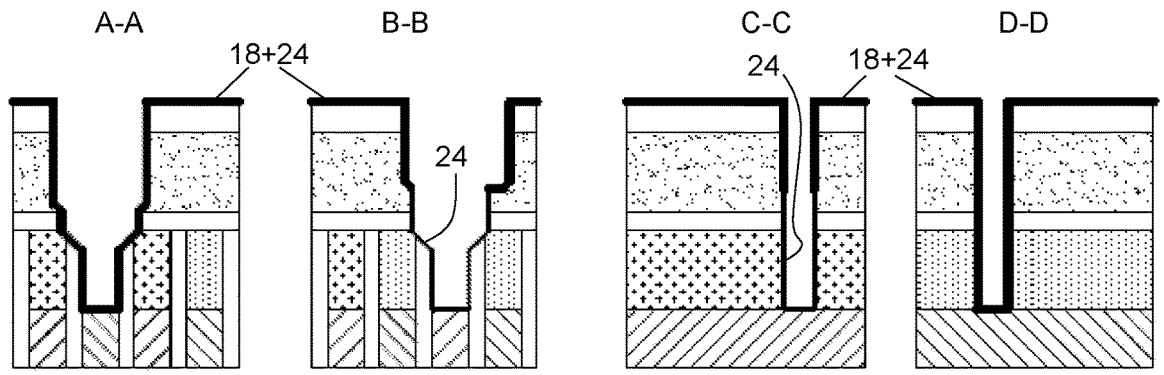

Then a second conformal Ti/TiN layer 24 is deposited, see FIG. 14. The second conformal layer 24 forms a diffusion barrier for the metal deposition applied in the next step. The first conformal layer 18 may first be stripped before depositing the second conformal layer 24, which has the advantage that the same thickness of Ti/TiN is deposited everywhere. Alternatively, the first layer 18 is not stripped and the second conformal layer may 24 be deposited on top of the first layer 18, as is the case in the drawings. This leads to some areas having a thicker conformal layer. This is nevertheless acceptable within the scope of the disclosed technology.

Figure 15:
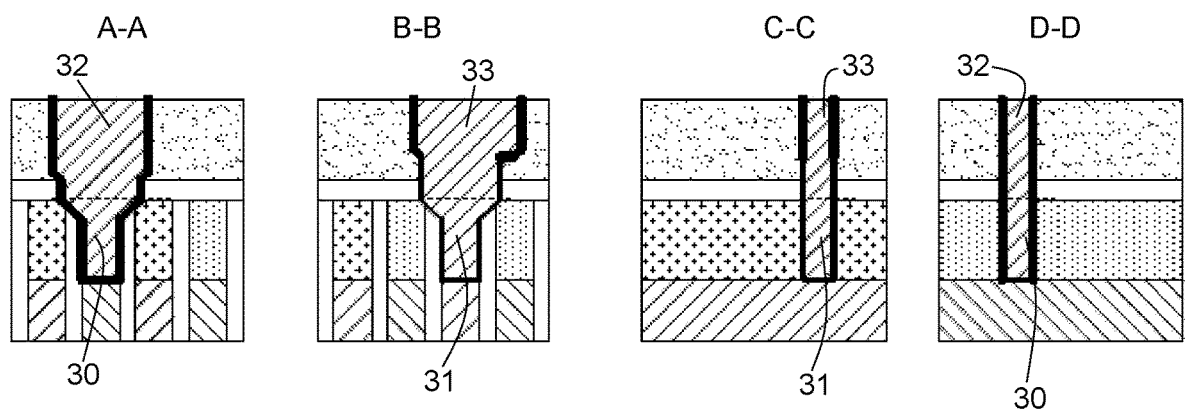

With reference to FIG. 15, this next step is a metal fill step, followed by a planarization step, including the removal of the TiN hardmask 8, leading to the formation of the Vint-A and Vint-G metal-filled via connections 30 and 31, and the conductors 32 and 33 of the first metallization level connected respectively to these via connections. The metal used for the metal fill step may be copper, tungsten or aluminium, deposited according to any known method, for example electroplating for depositing Cu. W could also be deposited by atomic layer deposition (ALD) or chemical vapour deposition (CVD). The layers 18 and 24 are electrically conductive layers, so as not to obstruct the electrical contact between the metal-filled vias 30 and 31 and the respective S/D and gate electrodes 2 and 1.

The embodiment described above is not limiting the scope of the disclosed technology. For example, the Vint-G etch may be done before the Vint-A etch instead of the other way around. The precise way in which the conductors 32 and 33 of the first metallization layer are formed is not limited to the way described above. As stated already in the description, the choice of the materials may have an influence on the order of the steps. The formation of the trenches 16 and 17 may take place in a separate etch step, performed before or after the formation of the vias 15 and 23, if the material of the PMD 7 is different from the material of the S/D plugs 5.

The second conformal layer 24 is required as a diffusion barrier for the metal deposition, when the above-cited materials are used in the method of the disclosed technology, and when the metal deposited thereafter is Cu, W or Al. However, if other materials are used, the second conformal layer may not be required, or it may be an optional layer. For example, when ruthenium is used as for the metal deposition, a diffusion barrier is not required.

If the trenches 16 and 17 are formed after the formation of the vias 15 and 23, the second conformal layer 24 will protect any exposed materials in the second via 23 that are not resistant to the etch process used for forming the trenches, during this latter etch process. This is advantageous compared to the prior art approach, which applies a third SOC mask, and etches back this mask to form protective plugs in the vias, prior to performing the trench etch.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or produced 'on' another layer or substrate, includes the options of
  said layer being present, produced or deposited directly on, i.e. in physical contact with, said other layer or substrate, and
  said layer being present, produced or deposited on one or a stack of intermediate layers between said layer and said other layer or substrate.

What is claimed is:

1. A method of producing via connections to a gate electrode and to a source (S) electrode or a drain (D) electrode, hereafter referred to as the S or D (S/D) electrode, of a nano-sized field effect transistor, the method comprising:
  providing a semiconductor wafer comprising a plurality of transistors, which include an array of mutually parallel electrodes, comprising gate electrodes and S or D (S/D) electrodes arranged between two adjacent gate electrodes, wherein:
    each of the gate electrodes is provided with a dielectric gate plug on top of said each of the gate electrodes,
    each of the S or D (S/D) electrodes is provided with a dielectric S or D (S/D) plug, respectively, on top of said each of the S or D (S/D) electrodes,
    first assemblies of the dielectric gate plug and the gate electrode and second assemblies of the dielectric S/D plug and the S/D electrode are separated by dielectric spacers,
    remaining areas between the first assemblies, the second assemblies, and the dielectric spacers are filled with a dielectric material, and
    upper surfaces of the dielectric S/D plugs, the dielectric gate plugs, the dielectric spacers and the dielectric material form a planarized surface,
  performing a first lithography and etch process to locally remove a portion of one of the dielectric S/D plugs and the dielectric gate plugs relative to the dielectric spacers and to the other one of the dielectric S/D plugs and the dielectric gate plugs, the removal of the portion of the one of the dielectric S/D plugs and the dielectric gate plugs leading to formation of a first contact via, said first contact via exposing a respective one of the S/D electrodes and the gate electrodes, wherein the first lithography and etch process is self-aligned with respect to the dielectric spacers;
  depositing a first conformal layer on the wafer, the first conformal layer lining the first contact via and covering the other one of the dielectric S/D plugs and the dielectric gate plugs;
  performing a second lithography and etch process, the second lithography and etch process comprising application of at least a first and a second etch recipe to:
    locally remove a portion of the first conformal layer covering the other one of the dielectric S/D plugs and the dielectric gate plugs by applying the first etch recipe,
    locally remove a portion of said other one of the dielectric S/D plugs and the dielectric gate plugs relative to the dielectric spacers and to the one of the dielectric S/D plugs and the dielectric gate plugs by applying the second etch recipe, the removal of the portion of the other one of the dielectric S/D plugs and the dielectric gate plugs leading to formation of a second contact via, said second contact via exposing the respective other one of the S/D electrodes and the gate electrodes, wherein the local removal of the portion of the other one of the dielectric S/D plugs and the dielectric gate plugs is self-aligned with respect to the dielectric spacers and wherein the first conformal layer is resistant to the second etch recipe; and
  filling the first contact via and the second contact via with an electrically conductive material to thereby form self-aligned first and second via connections configured to contact the one of the S/D electrodes and the gate electrodes and the other one of the S/D electrodes and the gate electrodes.

2. The method according to claim 1, wherein:
  the first lithography and etch process comprises depositing and patterning a first mask layer, so that a first opening is formed in the first mask layer that overlaps the one of the dielectric S/D plugs and the dielectric gate plugs in the direction perpendicular to the dielectric spacers, said first opening being wider than the one of the dielectric S/D plugs and the dielectric gate plugs as seen in said direction perpendicular to the dielectric spacers,
  the second lithography and etch process comprises depositing and patterning a second mask layer, so that a second opening is formed in the second mask layer that overlaps the other one of the dielectric S/D plugs and the dielectric gate plugs in the direction perpendicular to the dielectric spacers, said second opening being wider than the other one of the dielectric S/D plugs and the dielectric gate plugs as seen in said direction perpendicular to the dielectric spacers.

3. The method according to claim 2 wherein a pre-metal dielectric (PMD) layer is deposited on the planarized surface before the first lithography and etch process and the second lithography and etch process, wherein the first and second mask layers are deposited on the pre-metal dielectric layer, wherein a width of the first opening in the first mask layer, as seen in the direction perpendicular to the dielectric spacers, is transferred by etching through the PMD layer to form a first opening in the PMD layer prior to performing the first lithography and etch process, and wherein a width of the second opening in the second mask layer, as seen in the direction perpendicular to the dielectric spacers, is transferred by etching through the PMD layer to form a second opening in the PMD layer prior to applying the second etch recipe.

4. The method according to claim 3, wherein the first mask layer is removed after the formation of the first opening in the PMD layer and prior to performing the first lithography and etch process, and wherein the second mask layer is removed after the formation of the second opening in the PMD layer and prior to applying the second etch recipe.

5. The method according to claim 3, wherein a second conformal layer is deposited on the wafer, after the formation of the second contact via and before the filling the second contact via.

6. The method according to claim 3, comprising forming first and second trenches in the PMD layer, wherein the filling is configured to fill the first contact via and the first trench to form the first via connection and a first conductor connected to the first contact via, and wherein the filling is configured to fill the second contact via and the second trench to form the second via connection and a second conductor connected to the second contact via, said first and second conductors being part of a first metallization level configured to contact the transistors.

7. The method according to claim 6, wherein the first lithography and etch process configured to form the first contact via also forms the first and second trenches in the PMD layer.

* * * * *